US012771295B2

(12) United States Patent
Jo et al.

(10) Patent No.: US 12,771,295 B2
(45) Date of Patent: Oct. 20, 2026

(54) MIXER

(71) Applicant: NTT, Inc., Tokyo (JP)

(72) Inventors: Teruo Jo, Tokyo (JP); Daisuke Kitayama, Tokyo (JP); Hiroyuki Takahashi, Tokyo (JP); Takeshi Sakamoto, Tokyo (JP)

(73) Assignee: NTT, INC., Tokyo (JP)

( * ) Notice: Subject to any disclaimer, the term of this patent is extended or adjusted under 35 U.S.C. 154(b) by 262 days.

(21) Appl. No.: 18/837,778

(22) PCT Filed: Feb. 15, 2022

(86) PCT No.: PCT/JP2022/005920
§ 371 (c)(1),
(2) Date: Mar. 12, 2025

(87) PCT Pub. No.: WO2023/157072
PCT Pub. Date: Aug. 24, 2023

(65) Prior Publication Data
US 2026/0012132 A1 Jan. 8, 2026

(51) Int. Cl.
*H03D 7/12* (2006.01)

(52) U.S. Cl.
CPC .................................... *H03D 7/125* (2013.01)

(58) Field of Classification Search
CPC ....................................................... H03D 7/125
See application file for complete search history.

(56) References Cited

U.S. PATENT DOCUMENTS 5,995,819 A * 11/1999 Yamaji ................. H03D 7/1458 455/333
6,348,830 B1 * 2/2002 Rebeiz ................. H03D 7/1425 327/359
6,388,502 B2 * 5/2002 Kaneki ................ H03D 7/1458 455/326
6,738,601 B1 * 5/2004 Rofougaran ....... H03H 11/1291 455/66.1
7,187,917 B2 * 3/2007 Lin ........................ H03B 27/00 327/119
7,308,244 B2 * 12/2007 Chang .................. H03D 7/1491 455/131
7,528,754 B1 * 5/2009 Bakkaloglu ........... H03M 3/504 375/295

(Continued)

OTHER PUBLICATIONS

Amin Q. Safarian, "Design and Analysis of an Ultrawide-Band Distributed CMOS Mixer," IEEE Transactions on Very Large Scale Integration (VLSI) Systems, vol. 13, No. 5, May 2005, pp. 618-629. As discussed in the specification.

(Continued)

*Primary Examiner* — Menatoallah Youssef
*Assistant Examiner* — Khareem E Almo
(74) *Attorney, Agent, or Firm* — Slater Matsil, LLP

(57) ABSTRACT

A mixer includes a transistor to which an IF signal of ae positive phase side is input, a transistor to which an IF signal of a negative phase side is input, a transistor to which an LO signal is input, and a synthesizer which synthesizes components of a RF frequency band output from the drain terminals of the transistors in a negative phase, and synthesizes components of an IF frequency band output from the drain terminals of the transistors in the same phase.

13 Claims, 13 Drawing Sheets

(56) References Cited

U.S. PATENT DOCUMENTS

| | | | | |
|---|---|---|---|---|
| 7,542,521 | B2 * | 6/2009 | Choi | H03D 7/165<br>375/283 |
| 7,596,362 | B2 * | 9/2009 | Shu | H03D 7/165<br>455/313 |
| 8,761,703 | B2 * | 6/2014 | Souto Diez | H04B 1/16<br>455/313 |
| 9,385,657 | B1 * | 7/2016 | Daftari | H03D 7/1458 |
| 9,548,788 | B2 * | 1/2017 | Morton | H04B 1/30 |
| 2009/0039943 | A1 * | 2/2009 | Kim | H03D 7/1441<br>327/361 |
| 2011/0148478 | A1 * | 6/2011 | Kang | H03D 7/1441<br>327/113 |
| 2011/0151820 | A1 * | 6/2011 | Kim | H03D 7/1441<br>455/311 |
| 2026/0012132 | A1 * | 1/2026 | Jo | H03D 7/125 |

OTHER PUBLICATIONS

Hamada et al., "300-GHz, 100-GB/s InP-HEMT Wireless Transceiver Using a 300-GHz Fundamental Mixer," 2018 IEEE/MTT-S International Microwave Symposium—IMS, Philadelphia, PA, USA, Jun. 2018, pp. 1480-1483. As discussed in the specification.

Maceachern et al., "A Charge-Injection Method for Gilbert Cell Biasing," Conference Proceedings. IEEE Canadian Conference on Electrical and Computer Engineering, Waterloo, ON, Canada, May 1998, vol. 1, pp. 365-368. As discussed in the specification.

* cited by examiner (a)

(b)

(c)

MIXER

CROSS-REFERENCE TO RELATED APPLICATIONS

This application is a national phase entry of PCT Application No. PCT/JP2022/005920, filed on Feb. 15, 2022, which application is hereby incorporated herein by reference.

TECHNICAL FIELD

The present invention relates to a mixer that converts the frequency of electrical signals.

BACKGROUND

Among circuits constituting a transceiver for radio communication, a radar, etc., the mixer is an important circuit which plays a role of performing frequency conversion. Among mixers, as easy configuration, there are generally three types of mixers: a single-ended mixer, a single-balanced mixer, and a double-balanced mixer.

FIG. 11 is a circuit diagram of a single-ended mixer disclosed in NPL 1. The single-ended mixer includes a transistor Q100 in which a gate terminal is connected to a local oscillator (LO) signal terminal 101, a source terminal is connected to a ground, and a drain terminal is connected to an intermediate frequency (IF) signal terminal 100 and a radio frequency (RF) signal terminal 102. In this circuit, when the IF signal is input to the IF signal terminal 100 and the LO signal is input to the LO signal terminal 101, the RF signal is output from the RF signal terminal 102.

FIG. 12 is a circuit diagram of a single-balanced mixer disclosed in NPL 2. The single-balanced mixer includes a transistor Q101 whose gate terminal is connected to an IF signal terminal 100*p* on a positive phase side, a transistor Q102 whose gate terminal is connected to an IF signal terminal 100*n* on a negative phase side, a tail transistor Q103 whose gate terminal is connected to the LO signal terminal 101, whose source terminal is connected to ground, and whose drain terminal is connected to the source terminals of the transistors Q101 and Q102, and a balun 103 which synthesizes the output of the drain terminal of the transistor Q101 and the output of the drain terminal of the transistor Q102 in negative phases.

IFp is an IF signal on the positive phase side, and IFn is an IF signal on the negative phase side. In the circuit shown in FIG. 12, when the IF signal on the positive phase side is input to the IF signal terminal 100*p*, the IF signal on the negative phase side is input to the IF signal terminal 100*n*, and the LO signal is input to the LO signal terminal 101, the RF signal is output from the RF signal terminal 102.

FIG. 13 is a circuit diagram of the double-balanced mixer disclosed in NPL 3. The double-balanced mixer includes a transistor Q104 whose gate terminal is connected to the IF signal terminal 100*p* on the positive phase side, a transistor Q105 whose gate terminal is connected to the IF signal terminal 100*n* on the negative phase side, a transistor Q106 whose gate terminal is connected to the LO signal terminal 101*p* on the positive phase side and whose source terminal is connected to the drain terminal of the transistor Q104, a transistor Q107 whose gate terminal is connected to the LO signal terminal 10 in on the negative phase side and whose source terminal is connected to the drain terminal of the transistor Q104, a transistor Q108 whose gate terminal is connected to the LO signal terminal 10 in on the negative phase side and whose source terminal is connected to the drain terminal of the transistor Q105, a transistor Q109 whose gate terminal is connected to the LO signal terminal 101*p* on the positive phase side and whose source terminal is connected to the drain terminal of the transistor Q105, a current source IS100 which supplies a constant current to the transistors Q104 and Q105, and a balun 104 which synthesizes outputs of the drain terminals of the transistors Q106 and Q108 and the outputs of the drain terminals of the transistors Q107 and Q109 in the negative phases.

LOp is an LO signal on the positive phase side, and LOn is an LO signal on the negative phase side. In the circuit shown in FIG. 13, when the LO signal on the positive phase side is input to the LO signal terminal 101*p*, the LO signal on the negative phase side is input to the LO signal terminal 101*n*, the IF signal on the positive phase side is input to the IF signal terminal 100*p*, and the IF signal on the negative phase is input to the IF signal terminal 100*n*, an RF signal is output from the RF signal terminal 102.

On the other hand, in recent years, a wide-band mixer which operates at a high frequency has been required as data rates have improved. Furthermore, the mixer on the transmission side needs to have high performance for suppressing a component in which the IF signal leaks to the RF signal terminal (IF rejection) and high performance for suppressing a component in which the LO signal leaks to the RF signal terminal (LO rejection).

The single-ended mixer has a problem that the suppression performance of an IF signal and an LO signal is low although the single-ended mixer is excellent in a wide band property because it can be constituted of only one diode or transistor.

The double-balanced mixer can achieve high suppression performance for both of the IF signal and the LO signal, but it is difficult to achieve a wide band because many intersections of signal wiring are required that cause band deterioration.

The single-balanced mixer has fewer intersections of the signal wiring and can achieve a relatively wide band, but has a problem that it can only suppress either the IF signal or the LO signal.

As described above, the related art has a problem that it is difficult to realize a mixer having a wide band and high suppression performance for both the IF signal and the LO signal.

CITATION LIST

Non Patent Literature

NPL 1 Hiroshi Hamada, et al., "300-GHz, 100-Gb/s InP-HEMT wireless transceiver using a 300-GHz fundamental mixer," 2018 IEEE/MTT-S International Microwave Symposium-IMS, IEEE, 2018

NPL 2 Amin Q. Safarian, Ahmad Yazdi, and Payam Heydari, "Design and analysis of an ultrawide-band distributed CMOS mixer," IEEE Transactions on Very Large Scale Integration (VLSI) Systems, VOL. 13, No. 5, pp. 618-629, 2005

NPL 3 Leonard A. MacEachern and Tajinder Manku, "A charge-injection method for Gilbert cell biasing," Conference Proceedings. IEEE Canadian Conference on Electrical and Computer Engineering (Cat. No. 98TH8341), Vol. 1, IEEE, 1998

SUMMARY

Technical Problem

Embodiments of the present invention have been made to solve the above problems, and an object thereof is to provide a mixer that has a wide band and can significantly reduce leakage of an IF signal and an LO signal to an RF signal terminal.

Solution to Problem

A mixer of embodiments of the present invention includes a first transistor in which an IF signal of a positive phase side is input to a gate terminal; a second transistor in which an IF signal of a negative phase side is input to a gate terminal; a third transistor in which an LO signal is input to a gate terminal, a source terminal is connected to ground, and a drain terminal is connected to source terminals of the first and second transistors; and a synthesizer configured to synthesize a component of an RF frequency band output from the drain terminal of the first transistor and a component of the RF frequency band output from the drain terminal of the second transistor in the negative phase, and synthesize a component of an IF frequency band output from the drain terminal of the first transistor and a component of the IF frequency band output from the drain terminal of the second transistor in a common phase.

In one configuration example of the mixer of the present invention, the synthesizer is a rat race type coupler, and includes a first terminal connected to the drain terminal of the first transistor, a second terminal connected to the drain terminal of the second transistor, a third terminal which outputs an RF signal, a first transmission line having a length λLO/2 (λLO is a wavelength of an LO signal) for connecting the first terminal and the second terminal, a second transmission line having a length λLO/4 for connecting the first terminal and the third terminal, and a third transmission line having a length 3λLO/4 for connecting the second terminal and the third terminal.

In one configuration example of the mixer of the present invention, when a wavelength of the signal of the highest frequency in the IF signal is defined as λIF and a wavelength of the LO signal is defined as λLO, a relationship of $\lambda LO=\alpha\times\lambda IF$ ($0\leq\alpha\leq0.12$) is satisfied.

In one configuration example of the mixer of the present invention, the first transmission line has a folded portion in the middle from the first terminal to the second terminal disposed in the vicinity of the first terminal.

One configuration example of the mixer of the present invention further includes capacitors inserted between the drain terminal of the first transistor and the first terminal of the synthesizer, and between the drain terminal of the second transistor and the second terminal of the synthesizer.

Advantageous Effects

According to embodiments of the present invention, by providing the synthesizer connected to the drain terminals of the first and second transistors, combining components of the RF frequency band output from the drain terminals of the first and second transistors in a negative phase, and combining the components of the IF frequency band output from the drain terminals of the first and second transistors in a common phase, it is possible to realize a mixer capable of greatly reducing leakage of the IF signal and the LO signal to the RF signal terminal in a wide band.

DETAILED DESCRIPTION OF ILLUSTRATIVE EMBODIMENTS

First Example

Figure 1:
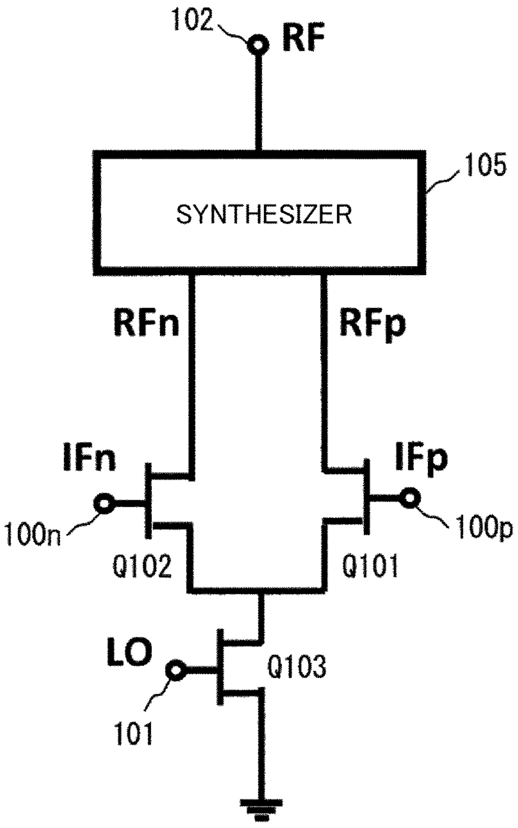
FIG. 1 is a circuit diagram of a mixer according to a first example of the present invention.

Referring to the drawings, a description will be given of examples of the present invention. FIG. 1 is a circuit diagram of a mixer according to a first example of the present invention. The mixer of the present example is a single-balanced mixer, and includes a transistor Q101 whose gate terminal is connected to an IF signal terminal 100*p* on the positive phase side, a transistor Q102 whose gate terminal is connected to an IF signal terminal 100*n* on the negative phase side, and a tail transistor Q103 whose gate terminal is connected to the LO signal terminal 101, whose source terminal is connected to ground, and whose drain terminal is connected to the source terminals of the transistors Q101 and Q102.

Further, the mixer of the present example includes a synthesizer 105 in which a first terminal is connected to the drain terminal of the transistor Q101, a second terminal is connected to the drain terminal of the transistor Q102, components of the RF frequency band output from each of the drain terminals of the transistors Q101 and Q102 are synthesized in negative phase, and components of the IF frequency band output from the drain terminals of the transistors Q101 and Q102 are synthesized in a common phase to output the RF signal from the third terminal (RF signal terminal 102).

The operation of the mixer of the present example will be explained in detail below. In the present example, the frequency of the IF signal is defined as fIF, and the frequency of the LO signal is defined as fLO.

Figure 2:
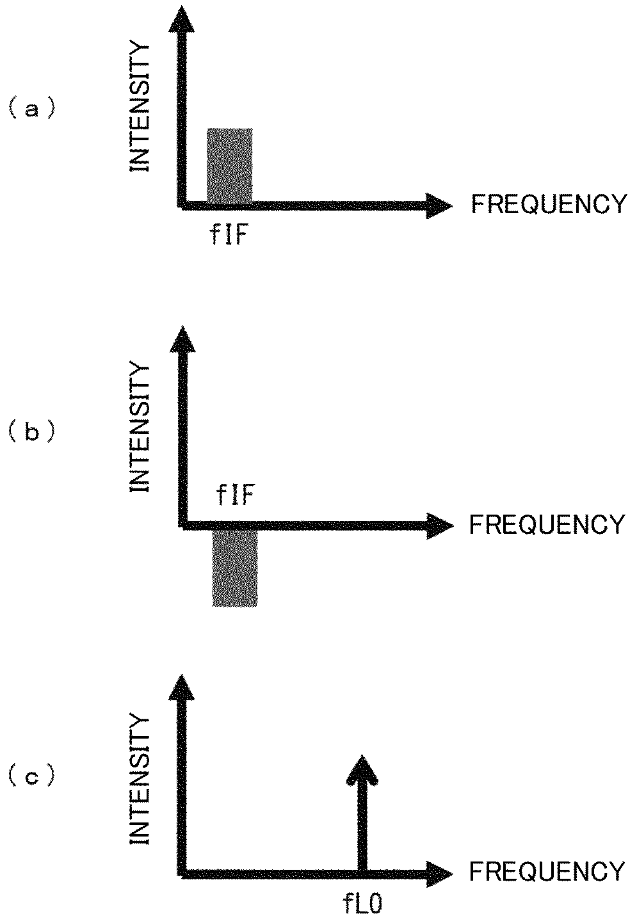
FIG. 2 is a diagram showing frequency spectrum of signals of various parts of the mixer according to the first example of the present invention.
Figure 3:
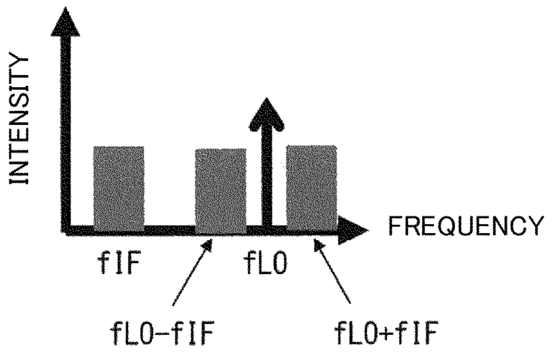
FIG. 3 is a diagram showing a frequency spectrum of signals of various parts of the mixer according to the first example of the present invention.
Figure 3:
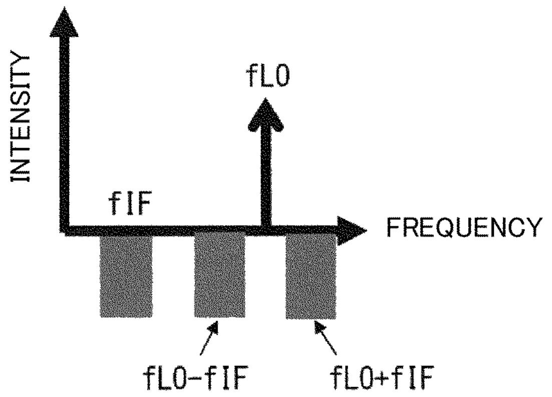
Figure 3:
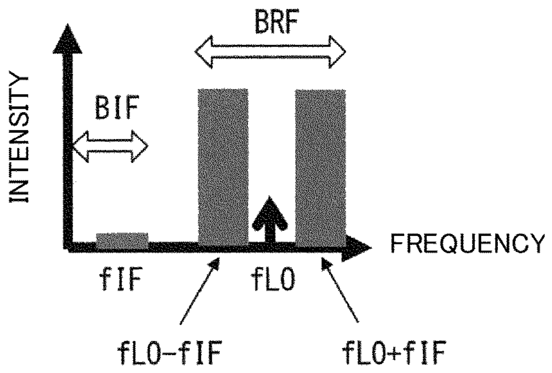

The frequency spectrum of the IF signal on the positive phase side (IFp) is shown in FIG. 2(*a*), the frequency spectrum of the IF signal on the negative phase side (IFn) is shown in FIG. 2(*b*), and the frequency spectrum of the LO signal is shown in FIG. 2(*c*). The frequency spectrum of the output RFp of the transistor Q101 is shown in FIG. 3(*a*), the frequency spectrum of the output RFn of the transistor Q102 is shown in FIG. 3(*b*), and the frequency spectrum of the output of the synthesizer 105 is shown in FIG. 3(*c*). In FIG. 3, BIF represents an IF frequency band, and BRF represents an RF frequency band.

When an IF signal of the positive phase side is input to the transistor Q101, an IF signal on the negative phase is input to the transistor Q102, and an LO signal is input to the tail transistor Q103, signals including components of frequencies fIF, fLO−fIF, fLO, and fLO+fIF are output to the differential outputs RFn and RFp of the differential pair transistors Q101 and Q102, respectively.

By coupling the synthesizer 105 to drain terminals of the transistors Q101 and Q102, synthesizing components of RF frequency bands of differential outputs RFn and RFp in negative phase, and synthesizing components of IF frequency bands in a common phase, it is possible, as will be described below, to achieve both the LO suppression function and the IF suppression function.

Since the components of the LO signals included in the differential outputs RFn and RFp exist in a common phase in the RF frequency band, they are synthesized in negative phases by the synthesizer 105 and cancel each other. Since the components of the IF signals included in the differential outputs RFn and RFp exist in negative phases in the IF frequency band, they are synthesized in a common phase by the synthesizer 105, and they cancel each other.

On the other hand, since the components of the frequency fLO−fIF included in the differential outputs RFn and RFp exist in negative phases in the RF frequency band, when synthesized in the negative phase by the synthesizer 105, the signal intensity is doubled and output to the RF signal terminal 102. Similarly, since the components of the frequency fLO+fIF included in the differential outputs RFn and RFp exist in the negative phases in the RF frequency band, the signal intensity is doubled and output to the RF signal terminal 102.

Figure 11:
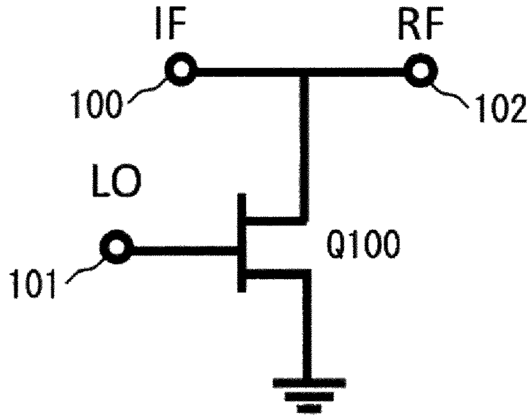
FIG. 11 is a circuit diagram of a single-ended mixer of the related art.
Figure 12:
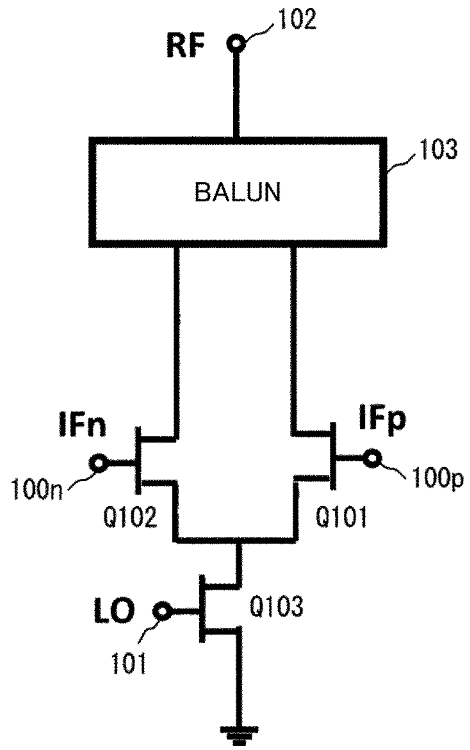
FIG. 12 is a circuit diagram of a single-balanced mixer of the related art.
Figure 13:
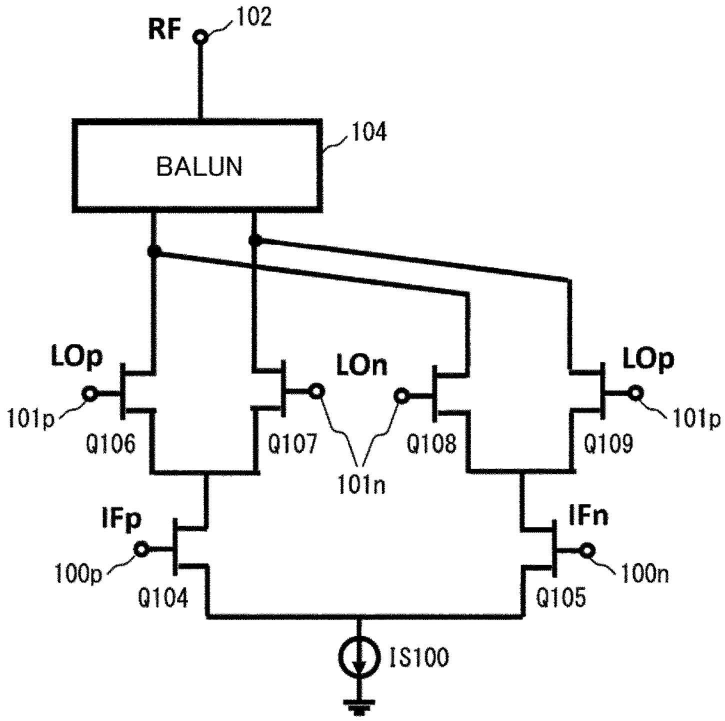
FIG. 13 is a circuit diagram of a double-balanced mixer of the related art.

In order to confirm the effect of the present example, simulation of conversion gain and simulation of suppression performance of the IF signal and the LO signal are performed for the single-ended mixer of the related art shown in FIG. 11 and the mixer of the present example. The conversion gain is a value obtained by standardizing the power of the RF signal after frequency conversion output from the mixer with the power of the IF signal before frequency conversion to be input to the mixer.

Figure 4:
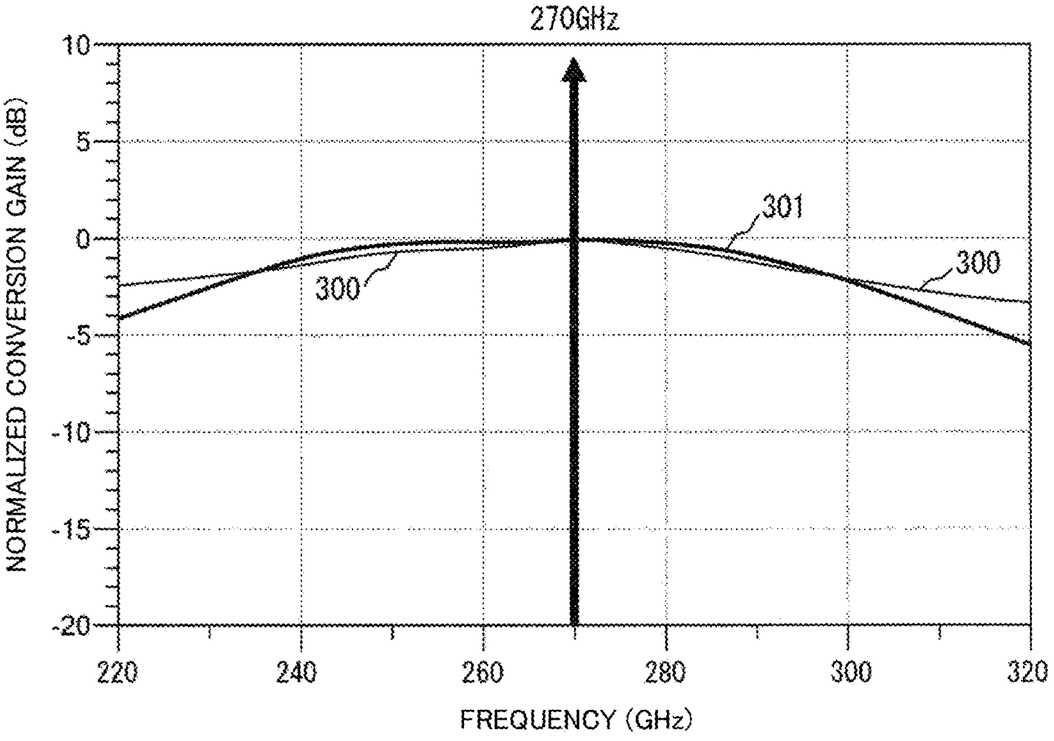
FIG. 4 is a diagram showing simulation results of conversion gains of a single-ended mixer of the related art and a mixer according to the first example of the present invention.

The simulation results for conversion gain are shown in FIG. 4. Reference numeral 300 of FIG. 4 shows the conversion gain characteristics normalized by the conversion gain at the LO signal frequency of 270 GHz for the single-ended mixer of the related art. Reference numeral 301 shows conversion gain characteristics normalized by the conversion gain at a frequency of 270 GHz of the LO signal in the mixer of the present example. When a band having a conversion gain of −3 dB or less is defined as an RF band on the basis of the conversion gain of the mixer at the frequency of the LO signal, it can be confirmed that the deterioration of the RF band caused by the single-balanced mixer of the present example from the single-ended mixer of the related art is suppressed to a small width.

Figure 5:
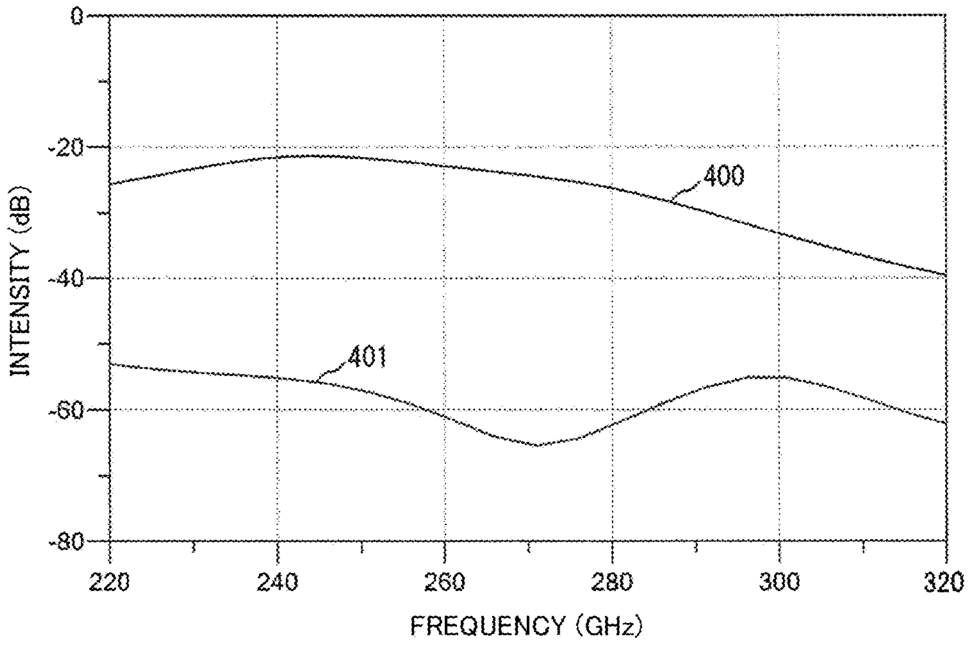
FIG. 5 is a diagram showing simulation results of suppression performance of an LO signal of a conventional single-end mixer and the mixer according to the first example of the present invention.

FIG. 5 shows a simulation result of the suppression performance of the LO signal. Reference numeral 400 of FIG. 5 shows the intensity of the LO signal leaking to the RF signal terminal 102 in the single-end mixer of the related art, and reference numeral 401 shows the intensity of the LO signal leaking to the RF signal terminal 102 in the mixer of the present example. By using the configuration of the present example, it can be confirmed that leakage of the LO signal to the RF signal terminal 102 can be improved by 25 dB or more as compared with the related art.

Figure 6:
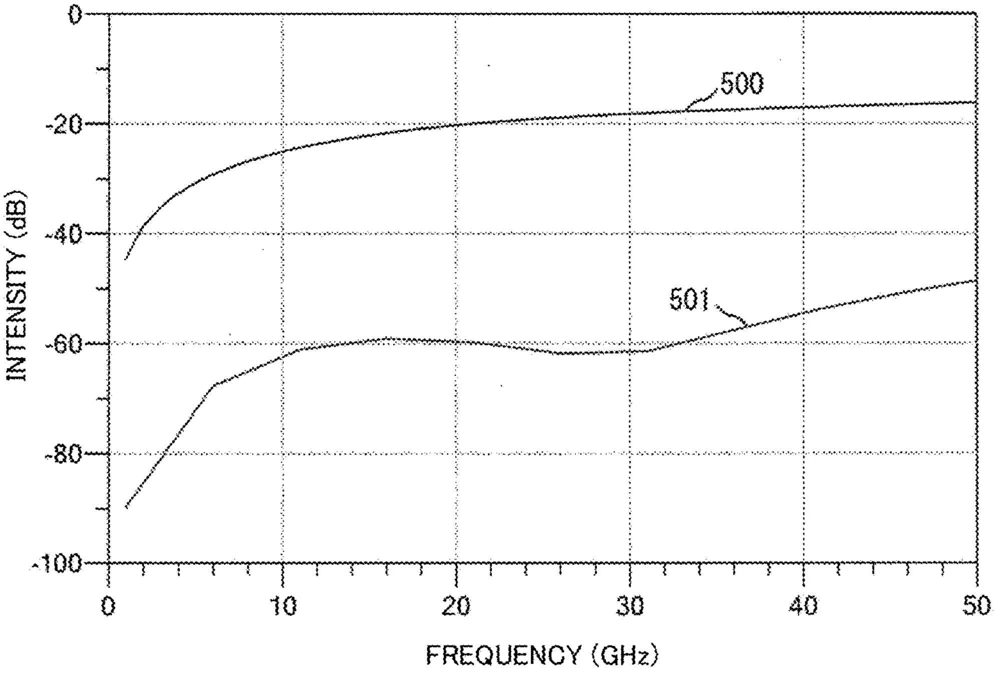
FIG. 6 is a diagram showing simulation results of suppression performance of the IF signal of the conventional single-end mixer and the mixer according to the first example of the present invention.

FIG. 6 shows a simulation result of the suppression performance of the IF signal. Reference numeral 500 of FIG. 6 shows the intensity of the IF signal leaking to the RF signal terminal 102 in the single-end mixer of the related art, and reference numeral 501 shows the intensity of the IF signal leaking to the RF signal terminal 102 in the mixer of the present example. By using the configuration of the present example, it can be confirmed that leakage of the IF signal to the RF signal terminal 102 can be improved by 40 dB or more as compared with the related art.

Second Example

Figure 7:
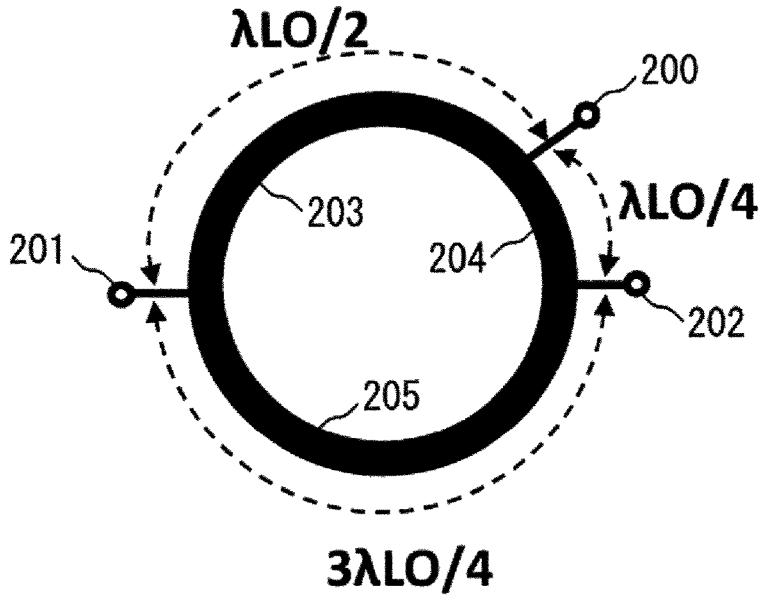
FIG. 7 is a plan view of a rat race type coupler according to a second example of the present invention.

Next, a description will be given of a second example of the present invention. The present example shows a specific example of the synthesizer 105 of the first example, and a rat race type coupler as shown in FIG. 7 is used as the synthesizer 105. The rat race type coupler is a coupler in which a transmission line 203 having a length λLO/2 (λLO is a wavelength of the LO signal) between a first terminal 200 and a second terminal 201, a transmission line 204 having a length λLO/4 between the first terminal 200 and the third terminal 202, and a transmission line 205 having a length 3λLO/4 between the second terminal 201 and the third terminal 202 are connected in a ring shape.

When the first terminal 200 is connected to the drain terminal of the transistor Q101 and the second terminal 201 is connected to the drain terminal of the transistor Q102, the third terminal 202 becomes the RF signal terminal 102. When the lengths of the transmission lines 203 to 205 are set as described above, it is possible to realize the synthesizer 105 that synthesizes the components of the RF frequency band of the differential outputs RFn and RFp of the differential pair transistors Q101 and Q102 in the negative phase and synthesizes the components of the IF frequency band in a common phase.

In the mixer in which the rat race type coupler of the present example is used as the synthesizer 105, even if the IF signal is a baseband signal including the DC component, leakage of the IF signal to the RF signal terminal 102 can be greatly reduced. Further, in the mixer in which the rat race type coupler is used as the synthesizer 105, since it is not necessary to insert a capacitor or a filter between the drain terminals of the differential pair transistors Q101 and Q102 and the synthesizer 105 as described later, it is possible to miniaturize the mixer and reduce loss. Further, it is also possible to supply voltage and current necessary for the operation of the transistors Q101 to Q103 from a load connected to the RF signal terminal 102.

Third Example

In the rat race type coupler of the second example, when the wavelength λIF of the signal of the highest frequency in the IF signal and the wavelength λLO of the LO signal satisfy the following relationship, high suppression performance can be achieved for both the IF signal and the LO signal.

$$\lambda LO = \alpha \times \lambda IF \quad (1)$$

In equation (1), a coefficient α takes a range of 0≤α≤0.12. A process of deriving equation (1) will be described. The IF signal having a wavelength λIF propagating through the rat race coupler of FIG. 7 is considered. When the signal cos(o) is input to the terminal 200, the signal S1 reaching the terminal 202 is expressed by the equation (2).

$$S1 = (1/2) \times \cos(\alpha\pi/2) + (1/2) \times \cos(5\alpha\pi/2) \quad (2)$$

When the signal cos(π) is input to the terminal 201, the signal S2 reaching the terminal 202 is expressed by equation (3).

$$S2 = \cos(\pi + 3\alpha\pi/2) \quad (3)$$

Therefore, the signal output from the terminal 202 is expressed by equation (4) as a result of adding the signals S1 and S2.

$$S1 + S2 = (1/2) \times \cos(\alpha\pi/2) + (1/2) \times \cos(5\alpha\pi/2) + \cos(\pi + 3\alpha\pi/2) \quad (4)$$

Figure 8:
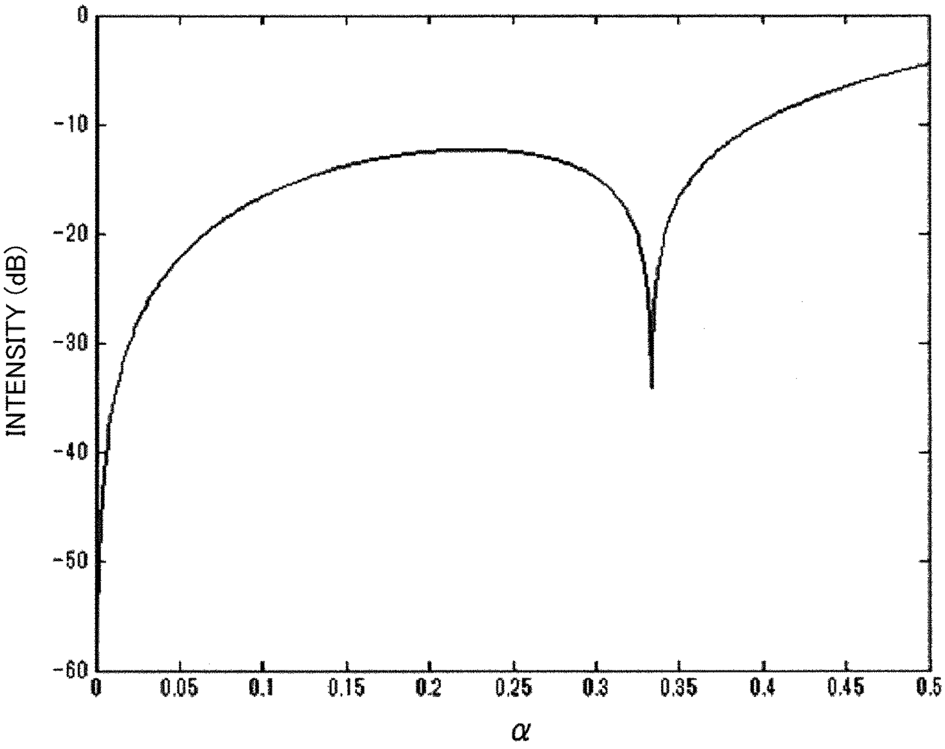
FIG. 8 is a diagram showing a relationship between coefficients that determine conditions of the signal frequency and the suppression performance of the IF signal.

For equation (4), the intensity of the signal S1+S2 (the intensity of the IF signal leaking to the RF signal terminal 102) is shown in FIG. 8 when the coefficient α is varied from 0 to 0.5. If the coefficient α is set in the range of 0≤α≤0.12, it is possible to suppress leakage of the IF signal to the RF signal terminal 102 to −15 dB or less.

For example, when the frequency of the LO signal is 270 GHz, high suppression performance of the IF signal can be obtained if the frequency of the IF signal is set to 32.4 GHz (270 GHz×0.12) or less.

Fourth Example

Generally, it is desirable that the wirings of the differential configuration for transmitting differential signals are disposed as close as possible to maintain the differential balance characteristics. Therefore, it is desirable that the first terminal 200 and the second terminal 201 of the rat race type coupler connected to the drain terminals of the differential pair transistors Q101 and Q102 are as close as possible.

Figure 9:
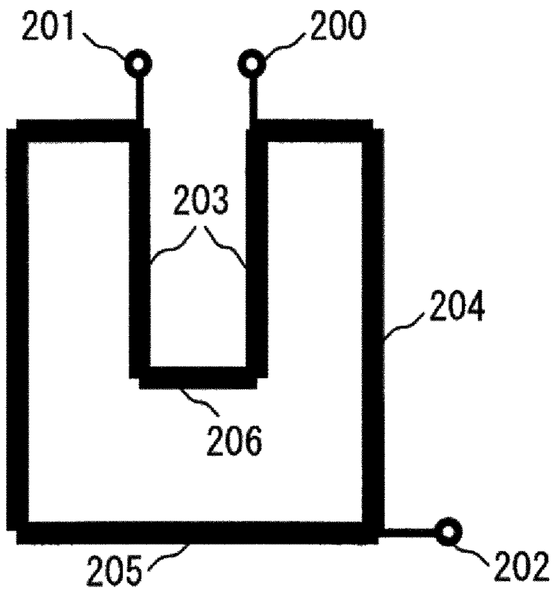
FIG. 9 is a plan view of a rat race type coupler according to a fourth embodiment of the present invention.

Therefore, as shown in FIG. 9, a folded portion 206 is provided in the middle of the transmission line 203 from the first terminal 200 to the second terminal 201 disposed in the vicinity of the first terminal 200. By using a folded transmission line as the transmission line 203, the first terminal 200 and the second terminal 201 can be disposed to be close to each other. The lengths of the transmission lines 203 to 205 are the same as the values shown in the second example.

By using the configuration of the present example, it is possible to realize a mixer having a good balance characteristic of differential signals, a wide band, and a high suppression performance of the IF signal and the LO signal.

Fifth Example

Figure 10:
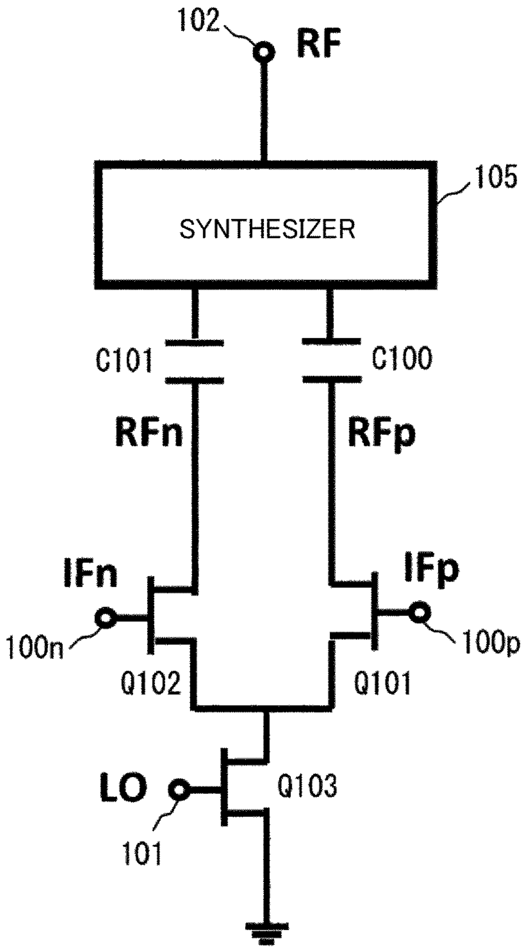
FIG. 10 is a circuit diagram of a mixer according to a fifth embodiment of the present invention.

FIG. 10 is a circuit diagram of a mixer according to a fifth example of the present invention. In the mixer of the present example, a capacitor C100 is inserted between the drain terminal of the transistor Q101 and the first terminal of the synthesizer 105, and a capacitor C101 is inserted between the drain terminal of the transistor Q102 and the second terminal of the synthesizer 105. According to the configuration of the present example, it is possible to improve the suppression performance of the IF signal.

INDUSTRIAL APPLICABILITY

Embodiments of the present invention can be applied to a mixer circuit that converts the frequency of a signal.

REFERENCE SIGNS LIST

Q101 to Q103 Transistor
C100, C101 Capacitor
105 Synthesizer
203 to 205 Transmission line
206 Folded portion

The invention claimed is:

1. A mixer comprising:
- a first transistor including a gate terminal to which an IF signal of a positive phase side is input;
- a second transistor including a gate terminal in which an IF signal of a negative phase side is input;
- a third transistor including a gate terminal to which an LO signal is input, a source terminal which is connected to ground, and a drain terminal which is connected to a source terminal of the first transistor and a source terminal of the second transistor; and
- a synthesizer configured to:
  - synthesize a component of an RF frequency band output from a drain terminal of the first transistor and a component of the RF frequency band output from a drain terminal of the second transistor in a negative phase; and
  - synthesize a component of an IF frequency band output from the drain terminal of the first transistor and a component of the IF frequency band output from the drain terminal of the second transistor in a common phase.

2. The mixer according to claim 1, wherein the synthesizer is a rat race type coupler, and includes:
- a first terminal connected to the drain terminal of the first transistor;
- a second terminal connected to the drain terminal of the second transistor,
- a third terminal configured to output an RF signal;
- a first transmission line having a length λLO/2 and connecting the first terminal to the second terminal, wherein λLO is a wavelength of the LO signal;
- a second transmission line having a length λLO/4 and connecting the first terminal to the third terminal; and
- a third transmission line having a length 3λLO/4 and connecting the second terminal to the third terminal.

3. The mixer according to claim 2, wherein when a wavelength of a signal of a highest frequency in the IF signal is defined as λIF, a wavelength of the LO signal is defined as λLO, a relationship of $\lambda LO=\alpha\times\lambda IF$ is satisfied, wherein $0\leq\alpha\leq0.12$.

4. The mixer according to claim 3, wherein the first transmission line has a folded portion between the first terminal and the second terminal.

5. The mixer according to claim 2, wherein the first transmission line has a folded portion between the first terminal and the second terminal.

6. The mixer according to claim 1, further comprising:
a first capacitor between the drain terminal of the first transistor and a first terminal of the synthesizer; and
a second capacitor between the drain terminal of the second transistor and a second terminal of the synthesizer.

7. A mixer comprising:
a first transistor including a gate terminal connected to an IF signal of a positive phase side is input;
a second transistor including a gate terminal in which an IF signal of a negative phase side is input;
a third transistor including a gate terminal to which an LO signal is input, a source terminal which is connected to ground, and a drain terminal which is connected to a source terminal of the first transistor and a source terminal of the second transistor; and
a synthesizer configured to:
synthesize a component of an RF frequency band output from a drain terminal of the first transistor and a component of the RF frequency band output from a drain terminal of the second transistor in a negative phase; and
synthesize a component of an IF frequency band output from the drain terminal of the first transistor and a component of the IF frequency band output from the drain terminal of the second transistor in a common phase, wherein the synthesizer is a rat race type coupler, and includes:
a first terminal connected to the drain terminal of the first transistor;
a second terminal connected to the drain terminal of the second transistor; and
a third terminal configured to output an RF signal.

8. The mixer according to claim 7, wherein the synthesizer further comprises:
a first transmission line having a length λLO/2 and connecting the first terminal to the second terminal, wherein λLO is a wavelength of the LO signal.

9. The mixer according to claim 8, wherein the first transmission line has a folded portion between the first terminal and the second terminal.

10. The mixer according to claim 7, wherein the synthesizer further comprises:
a second transmission line having a length λLO/4 and connecting the first terminal to the third terminal, wherein λLO is a wavelength of the LO signal.

11. The mixer according to claim 7, wherein the synthesizer further comprises:
a third transmission line having a length 3λLO/4 and connecting the second terminal to the third terminal, wherein λLO is a wavelength of the LO signal.

12. The mixer according to claim 7, wherein when a wavelength of a signal of a highest frequency in the IF signal is defined as λIF, a wavelength of the LO signal is defined as λLO, a relationship of $\lambda LO=\alpha\times\lambda IF$ is satisfied, wherein $0\leq\alpha\leq0.12$.

13. The mixer according to claim 7, further comprising:
a first capacitor between the drain terminal of the first transistor and the first terminal of the synthesizer; and
a second capacitor between the drain terminal of the second transistor and the second terminal of the synthesizer.

* * * * *